(12) United States Patent
English et al.

(10) Patent No.: US 9,635,789 B2
(45) Date of Patent: Apr. 25, 2017

(54) BOARD LEVEL ELECTROMAGNETIC INTERFERENCE (EMI) SHIELDS WITH INCREASED UNDER-SHIELD SPACE

(71) Applicant: Laird Technologies, Inc., Earth City, MO (US)

(72) Inventors: Gerald R. English, Glen Ellyn, IL (US); Joseph C. Boetto, Hoffman Estates, IL (US); Philip van Haaster, Corona, CA (US)

(73) Assignee: Laird Technologies, Inc., Earth City ( * ) Notice: Subject to any disclaimer, the term of this patent is extended or adjusted under 35 U.S.C. 154(b) by 0 days.

(21) Appl. No.: 14/696,974

(22) Filed: Apr. 27, 2015

(65) Prior Publication Data

US 2016/0227679 A1    Aug. 4, 2016

Related U.S. Application Data

(60) Provisional application No. 62/109,725, filed on Jan. 30, 2015.

(51) Int. Cl.
| | |
|---|---|
| *B23P 13/04* | (2006.01) |
| *B23P 17/00* | (2006.01) |
| *H01C 17/00* | (2006.01) |
| *H05K 9/00* | (2006.01) |

(52) U.S. Cl.
CPC .......... *H05K 9/0024* (2013.01); *H05K 9/003* (2013.01); *H05K 9/0026* (2013.01); *H05K 9/0073* (2013.01)

(58) Field of Classification Search
CPC .... H05K 9/0024; H05K 9/0026; H05K 9/003; H05K 9/0073; H05K 13/0084; Y10T 29/49128

USPC ......... 29/527.1, 557, 558, 592.1, 610.1, 887
See application file for complete search history.

(56) References Cited

U.S. PATENT DOCUMENTS

| | | | | |
|---|---|---|---|---|
| 5,482,898 | A | * | 1/1996 | Marrs .................. H01L 21/565 257/E21.504 |
| 6,377,475 | B1 | * | 4/2002 | Reis ..................... H05K 9/0035 174/387 |
| 6,717,485 | B2 | | 4/2004 | Kolb et al. |
| 6,743,975 | B2 | | 6/2004 | Kolb |
| 6,744,640 | B2 | | 6/2004 | Reis et al. |

(Continued)

*Primary Examiner* — Sarang Afzali
*Assistant Examiner* — Darrell C Ford
(74) *Attorney, Agent, or Firm* — Harness, Dickey & Pierce, P.L.C.

(57) ABSTRACT

According to various aspects, exemplary embodiments are disclosed of EMI shields with increased under-shield space and/or greater component clearance for one or more components under the shield. In an exemplary embodiment, a shield generally includes one or more recessed portions along an inner surface of the cover. Dielectric material is along the inner surface of the cover within at least the one or more recessed portions. The one or more recessed portions may provide increased under-shield space and/or greater clearance for one or more components under the shield. The dielectric material may inhibit the one or more recessed portions of the shield from directly contacting and electrically shorting one or more components when the one or more components are under the shield. Also disclosed are exemplary embodiments of methods relating to making EMI shields and methods relating to providing shielding for one or more components on a substrate.

22 Claims, 9 Drawing Sheets

(56) References Cited

U.S. PATENT DOCUMENTS

| | | | |
|---|---|---|---|
| 6,849,800 B2 | 2/2005 | Mazurkiewicz | |
| 6,873,031 B2 | 3/2005 | McFadden et al. | |
| 7,388,281 B2* | 6/2008 | Krueger | H03H 9/0557 |
| | | | 257/678 |
| 7,656,047 B2* | 2/2010 | Yang | H01L 23/29 |
| | | | 257/787 |
| 8,062,930 B1* | 11/2011 | Shah | C23C 4/06 |
| | | | 438/110 |
| 8,384,604 B2 | 2/2013 | Niederkorn et al. | |
| 8,847,184 B2 | 9/2014 | Cheng et al. | |
| 9,508,624 B2* | 11/2016 | Yoo | H01L 23/552 |
| 2002/0014673 A1* | 2/2002 | Leedy | G03F 7/70658 |
| | | | 257/419 |
| 2002/0129951 A1* | 9/2002 | Babb | H01L 23/552 |
| | | | 174/358 |
| 2003/0155987 A1* | 8/2003 | Kolb | H04B 15/02 |
| | | | 333/12 |
| 2004/0058476 A1* | 3/2004 | Enquist | B81C 1/00269 |
| | | | 438/114 |
| 2005/0095410 A1* | 5/2005 | Mazurkiewicz | H01L 23/552 |
| | | | 428/209 |
| 2006/0151203 A1* | 7/2006 | Krueger | H03H 9/0557 |
| | | | 174/260 |
| 2008/0106884 A1* | 5/2008 | English | H05K 9/0032 |
| | | | 361/818 |
| 2009/0067149 A1* | 3/2009 | Bogursky | H01L 23/552 |
| | | | 361/816 |
| 2009/0302439 A1* | 12/2009 | Pagaila | H01L 23/29 |
| | | | 257/660 |
| 2010/0006988 A1* | 1/2010 | Tang | H01L 21/6835 |
| | | | 257/659 |
| 2010/0032815 A1* | 2/2010 | An | H01L 23/3121 |
| | | | 257/660 |
| 2010/0157566 A1* | 6/2010 | Bogursky | H05K 9/0032 |
| | | | 361/816 |
| 2011/0120764 A1* | 5/2011 | Kelley | H01L 23/573 |
| | | | 174/377 |
| 2011/0215450 A1* | 9/2011 | Chi | H01L 23/48 |
| | | | 257/660 |
| 2011/0279995 A1* | 11/2011 | Bayar | H05K 9/0022 |
| | | | 361/818 |
| 2012/0044653 A1* | 2/2012 | Morris | H05K 1/0218 |
| | | | 361/728 |
| 2012/0140423 A1* | 6/2012 | Fisher, Jr. | H05K 3/284 |
| | | | 361/748 |
| 2012/0147571 A1* | 6/2012 | Just | H05K 1/0218 |
| | | | 361/750 |
| 2012/0320558 A1* | 12/2012 | Foster | H05K 1/0218 |
| | | | 361/818 |
| 2013/0056244 A1* | 3/2013 | Srinivas | G06F 3/041 |
| | | | 174/250 |
| 2014/0166350 A1* | 6/2014 | Rappoport | H01Q 1/38 |
| | | | 174/258 |

* cited by examiner

BOARD LEVEL ELECTROMAGNETIC INTERFERENCE (EMI) SHIELDS WITH INCREASED UNDER-SHIELD SPACE

CROSS-REFERENCE TO RELATED APPLICATION

This patent application claims the benefit of and priority to U.S. Provisional Patent Application No. 62/109,725 filed Jan. 30, 2015. The entire disclosure of the above application is incorporated herein by reference.

FIELD

The present disclosure generally relates to board level EMI shields with increased under-shield space and/or greater clearance for components under the shield.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source.

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

SUMMARY

This section provides a general summary of the disclosure, and is not a comprehensive disclosure of its full scope or all of its features.

According to various aspects, exemplary embodiments are disclosed of EMI shields with increased under-shield space and/or greater component clearance for one or more components under the shield. In an exemplary embodiment, a shield generally includes one or more recessed portions along an inner surface of the shield. Dielectric material is along the inner surface of the shield within at least the one or more recessed portions. The one or more recessed portions may provide increased under-shield space and/or greater clearance for one or more components under the shield. The dielectric material may inhibit the one or more recessed portions of the shield from directly contacting and electrically shorting one or more components when the one or more components are under the shield.

Also disclosed are exemplary embodiments of methods relating to making EMI shields. In an exemplary embodiment, a method generally includes providing dielectric material along an inner surface of a shield having one or more recessed portions such that the dielectric material is within at least the one or more recessed portions.

Exemplary embodiments of methods relating to providing shielding for one or more components on a substrate are also disclosed. In an exemplary embodiment, a method generally includes installing a shield to a substrate such that one or more components are disposed under one or more recessed portions along an inner surface of the shield. Dielectric material is within at least the one or more recessed portions.

Also disclosed are exemplary methods for providing dielectric material along portions of EMI shields. In an exemplary embodiment, a method generally includes providing an ultraviolet (UV) curable dielectric material along a portion of an EMI shield and curing the dielectric material through exposure to UV. The UV-cured dielectric material may inhibit the portion of the EMI shield from directly contacting and electrically shorting one or more components.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

Disclosed herein are exemplary embodiments of electromagnetic (EMI) shields, shielding apparatus, or assemblies that have increased under-shield space and greater clearance for components under the shield. In exemplary embodiments, an EMI shield includes one or more sidewalls and a cover. An inner surface of the cover and/or an inner surface of at least one the one or more sidewalls may include one or more recesses or recessed portions (e.g., pockets or cavities, etc.). The one or more recessed portions may increase the under-shield space and/or provide greater clearance for components under the shield. For example, one or more pockets or cavities may be etched, embossed, machined, forged, etc. into or along an inner surface of the shield. In an exemplary embodiment, the cover includes two disjoint pockets that are adjacent or side-by-side. The two pockets are spaced apart from each other with an internal wall or divider therebetween.

Dielectric material (e.g., a dielectric coating, electrical insulation, etc.) is provided within and/or along the recessed portions of the shield to provide electrical isolation from components under the shield. Dielectric material may also be provided along other portions of shield. For example, dielectric material may be provided along one or more non-recessed portions of the shield's cover and/or sidewalls. The dielectric material acts as an intermediary between the components and the portions of the shield having the dielectric material thereon to prevent direct contact between the components and the electrically-conductive material from which the shield is made. The dielectric material thus inhibits or prevents portions of the shield having the dielectric material thereon from electrically shorting components received under the cover. By way of example, a dielectric coating may be deposited or dispensed within at least the recessed portions, e.g., via an ink jet process, print nozzle, or other suitable process. The dielectric coating may then be cured with ultraviolet light, etc. In an exemplary embodiment, the dielectric coating may provide electrical resistance greater than 4 gigaohms at 1000 volts with a 1 mm probe tip diameter and 100 gram weight. The dielectric coating may capable of withstanding or surviving lead-free reflow temperatures, such as a temperature of at least 260 degrees Celsius (e.g., 300 degrees Celsius, 350 degrees Celsius, etc.). The dielectric coating may comprise a blend of polymers, with acrylate polymers as the primary component, along with other components urethane, polyester and polyvinyl polymers, photo initiators, and other additives, etc. The dielectric coating may be disposed only along the recessed portions in some embodiments. In other embodiments, the dielectric coating may also disposed along and outside the recessed portions. For example, the dielectric coating may be disposed along one or more non-recessed portions of the shield's cover and/or sidewalls.

Figure 1:
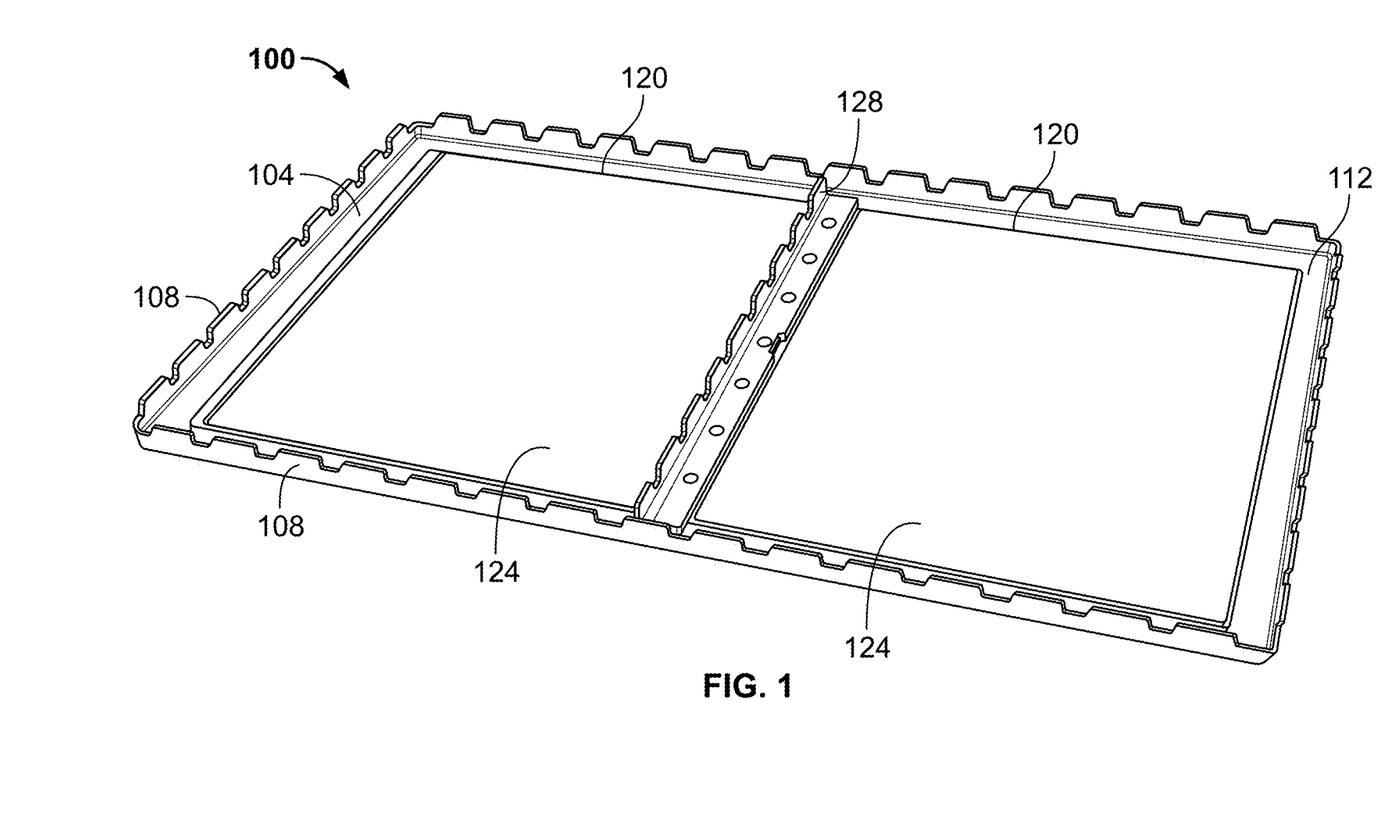
FIG. 1 is a perspective underside view of an EMI shield with increased under-shield space according to an exemplary embodiment in which the shield includes pockets or cavities, dielectric material along the pockets, and an internal wall or divider between the pockets.

With reference to the figures, FIG. 1 illustrates an exemplary embodiment of a EMI shield 100 according to aspects of the present disclosure. The EMI shield 100 includes a cover 104 (broadly, a top or upper surface) and sidewalls 108 depending from (e.g., attached to, integrally connected with, etc.) the cover 104. The sidewalls 108 are configured for installation to a substrate (e.g., printed circuit board (PCB), etc.) generally about one or more components on the substrate such that the one or more components are under the shield 100 and/or within an interior or shielding enclosure cooperatively defined by the sidewalls 108 and the cover 104. When the shield 100 is installed (e.g., soldered, etc.) on the substrate, the shield 100 is operable for shielding the one or more components that are within the interior or shielding enclosure cooperatively defined by the sidewalls 108 and the cover 104.

Figure 2:
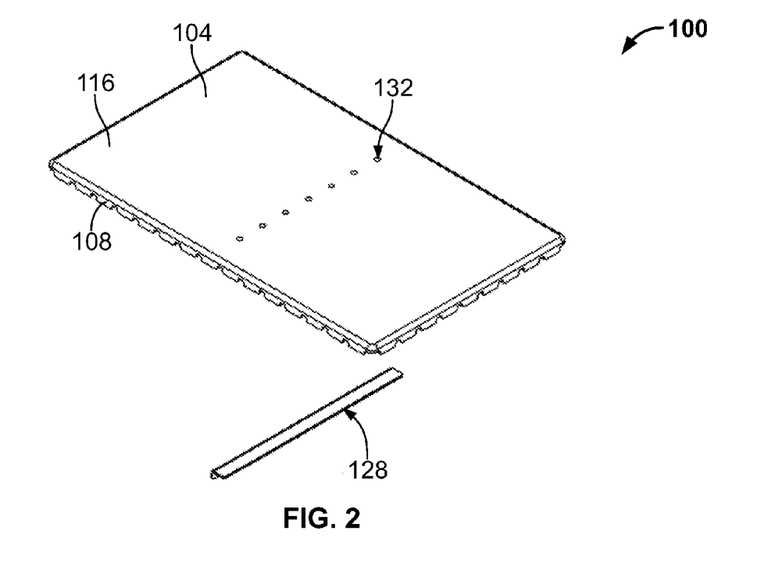
FIG. 2 is an exploded upper perspective view of the EMI shield shown in FIG. 1 before the internal wall or divider has been attached (e.g., welded, etc.) to the inner surface of the shield between the pockets.
Figure 7:
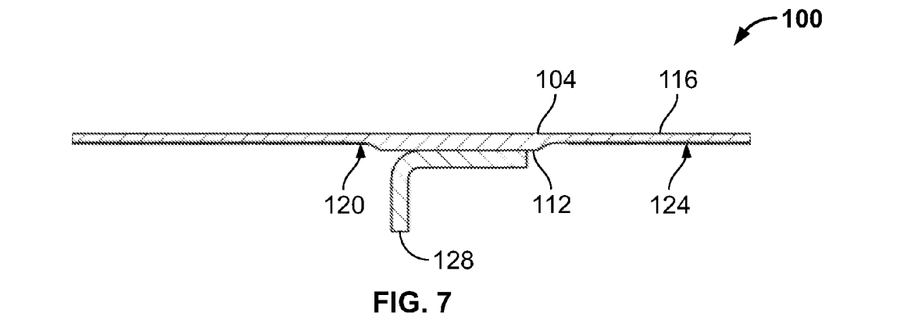
FIG. 7 illustrates the portion of the EMI shield that is circled and designated A in FIG. 6 including example dimensions in millimeters (inches) that may be used for the EMI shield.
Figure 8:
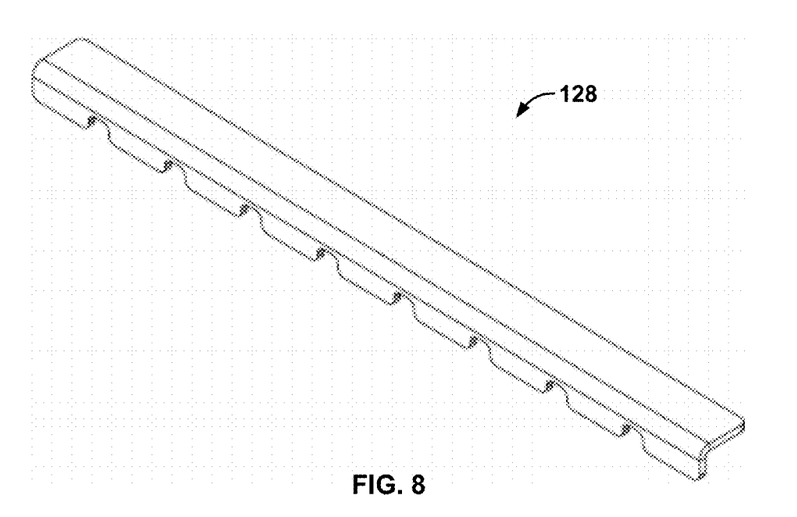
FIG. 8 is a perspective view of the internal wall or divider shown in FIG. 1 before attachment to the inner surface of the shield.
Figure 9:
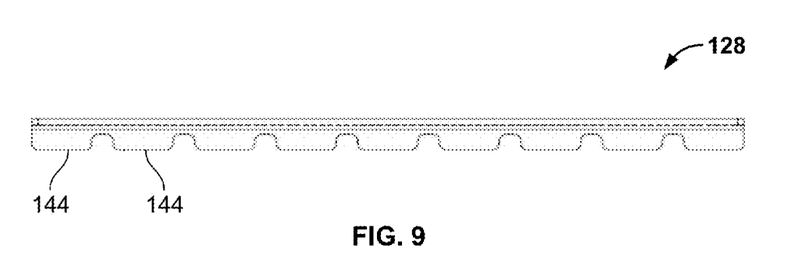
FIG. 9 is a side view of the internal wall or divider shown in FIG. 8.

The cover 104 includes an inner surface 112 (FIG. 1) and an outer surface 116 (FIG. 2). As shown in FIGS. 1 and 7, the cover's inner surface 112 includes two disjoint pockets or cavities 120 (broadly, recessed portions or recesses). In this example, the pockets 120 are side-by-side but spaced apart from each other with a gap therebetween. The pockets 120 may be formed by removing material from the cover 104 to thereby reduce the material thickness at the location of the pockets 120. For example, FIG. 7 shows that the pockets 120 have a depth of 0.07 mm as the thickness of the material has been reduced from about 0.15 mm (+/−0.015 mm) to about 0.08 mm (+/−0.013 mm). Accordingly, the cover 104 includes different thicknesses depending on the location. For example, the cover 104 has a thickness of about 0.15 mm at the middle or central portion between the pockets 120 and along the perimeter edges adjacent the sidewalls 108. The cover 104 has a reduced thickness of 0.08 mm along the pockets 120.

By way of example, the pockets 120 may be created by etching (e.g., chemical etching, laser etching, etc.) a sheet, strip, blank, or piece of electrically-conductive material (e.g., metal, metal alloy, etc.). Or, for example, the pockets 120 may be created by another process, such as embossing, machining, forging, etc. The pockets 120 may be created before or after stamping the material with the flat pattern profile for the shield 100. The flat profile pattern for the shield 100 may include the cover 104, sidewalls 108, and mounting feet 140. The pockets 120 may be created or formed in a stamped piece of material before or after the stamped piece of material is folded or bent to position the sidewalls 108 generally perpendicular to the cover 104. By way of example only, an exemplary embodiment includes pockets 120 that are etched into a substrate or flat piece of metal before stamping the metal. In this example, the etching process may include applying a mask to the substrate and then removing the mask only at the locations at which the pockets will be formed to thereby expose the areas of the substrate that will be etched. The mask may be removed, for example, by laser ablation or with chemical dissolution of the photosensitized mask. The etching chemical (e.g., ferric chloride, etc.) may then be introduced to dissolve the exposed metal and form the pockets in the substrate or flat piece of metal. The remaining mask is then removed from the substrate. Alternative embodiments may include one or more pockets formed at other locations (e.g., in the shield's sidewalls, etc.) and/or by a different method or process, such as embossing, machining, forging, etc. Accordingly, aspects of the present disclosure are not limited to any one particular process for creating or forming the pockets.

As shown in FIG. 1, dielectric material 124 (e.g., a dielectric coating, electrical insulation, etc.) is provided within and/or along the pockets 120. The dielectric material 124 is configured to provide electrical isolation from components under the shield 100. The dielectric material 124 acts as an intermediary between the components and the cover 104 to prevent direct contact between the components and the electrically-conductive material from which the cover 104 is made. The dielectric material 124 thus inhibits or prevents the cover 104 from electrically shorting components received under the cover 104.

By way of example, the dielectric material 124 may comprise a dielectric coating deposited or dispensed within at least the pockets 120 via an ink jet process, a print nozzle, etc. Alternatively, the dielectric coating may be applied via other processes, such as pad printing, flexographic printing, powder coating, etc. The dielectric coating may be cured with ultraviolet light, thermally cured, etc. In an exemplary embodiment, the dielectric coating may provide electrical resistance greater than 4 gigaohms at 1000 volts with a 1 mm probe tip diameter and 100 gram weight. The dielectric coating may be able to withstand or survive lead-free reflow temperatures, such as a temperature of 260 degrees Celsius or higher, etc.

In some embodiments, the dielectric material 124 may include one or more fillers and/or additives to achieve various desired outcomes. For example, the dielectric coating may include thermally-conductive filler such that the dielectric coating is also thermally conductive and operable as a thermal interface material. Examples of other fillers that may be added include pigments, plasticizers, process aids, flame retardants, extenders, tackifying agents, etc.

Figure 6:
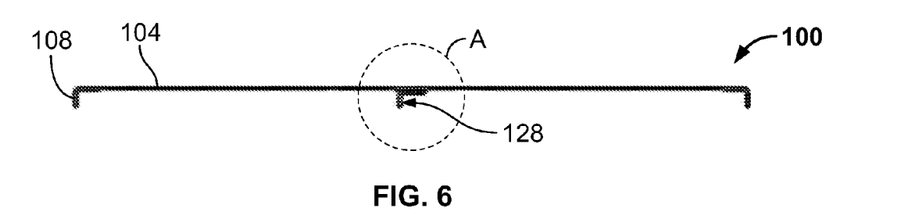
FIG. 6 is a cross-sectional view of the EMI shield taken along the line B-B in FIG. 3 including example dimensions in millimeters (inches) that may be used for the EMI shield.

As shown in FIGS. 1, 6, and 7, the shield 100 includes an internal wall, divider, or partition 128 disposed along the gap or portion of the cover 104 between the two pockets 120. FIGS. 2 and 8-10 shows the internal wall 128 before it is applied (e.g., welded, etc.) to the shield 100. By way of example, the internal wall 128 may be welded (e.g., laser welded, resistance welded, etc.) to the inner surface of the shield's cover 104, e.g., at a location that does not have any pockets or does not have a reduced thickness, etc.

The internal wall 128 improves EMI isolation as the internal wall 128 cooperates with the shield's cover 104 and sidewalls 108 to define two individual EMI shielding compartments. When the EMI shield 100 is installed (e.g., adhesively attached, soldered to soldering pads, etc.) to a substrate (e.g., printed circuit board, etc.), components on the substrate may be positioned in different compartments such that the components are provided with EMI shielding by virtue of the EMI shielding compartments inhibiting the ingress and/or egress of EMI into and/or out of each EMI shielding compartment. In other exemplary embodiments, the EMI shield may not include or may be free of interior walls, dividers, or partitions such that the sidewalls and cover of the EMI shield generally define a single interior space or compartment.

Figure 3:
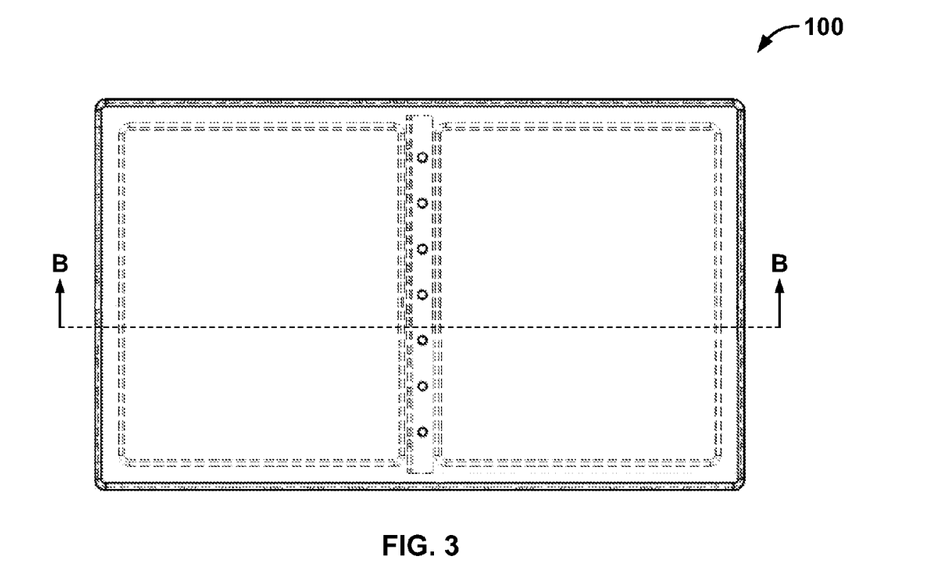
FIG. 3 is a top view of the EMI shield shown in FIG. 1 including example dimensions in millimeters (inches) that may be used for the EMI shield.

As shown in FIGS. 1 and 3, there are seven weld spots 132 for the internal wall 128. In this example, the weld spots 132 comprise circular areas having a diameter less than 1 mm (e.g., 0.4 mm, etc.). Alternative embodiments may be configured differently, such as a different attachment method for the internal wall, different weld spots (e.g., non-circular weld spots or areas, larger or smaller weld spots or areas, etc.), and/or an internal wall integral with the cover, etc.

As shown in FIG. 1, the dielectric material 124 is disposed only along the pockets 120. In other embodiments, dielectric material may also be disposed outside the pockets 120.

Figure 4:
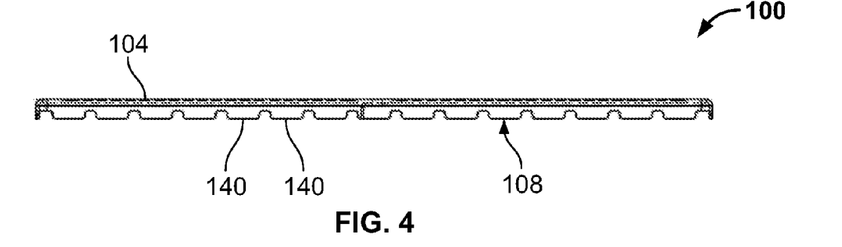
FIG. 4 is a side view of the EMI shield shown in FIG. 1 including example dimensions in millimeters (inches) that may be used for the EMI shield.
Figure 5:
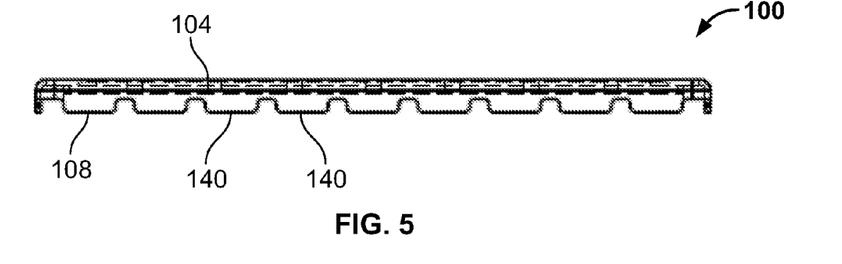
FIG. 5 is an end view of the EMI shield shown in FIG. 1.
Figure 13:
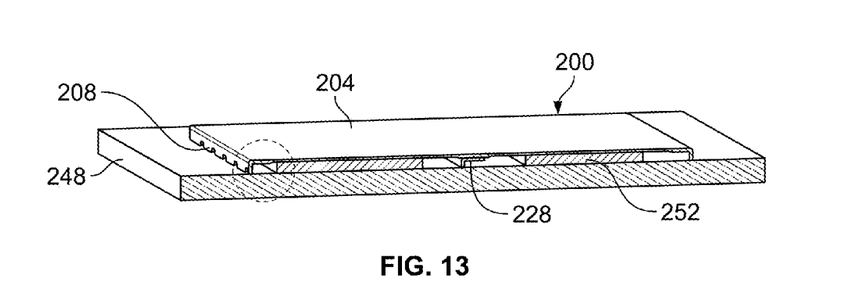
FIG. 13 is a perspective cross-sectional view of the EMI shield shown in FIG. 12, and showing PCB components under the shield.
Figure 14:
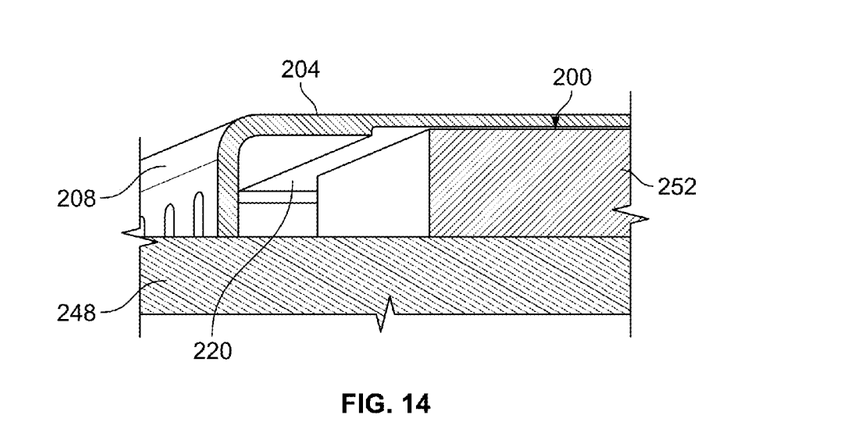
FIG. 14 illustrates the portion of the EMI shield and PCB circled in FIG. 13, and showing the top of the PCB component positioned within the pocket in the EMI shield, whereby the pocket increased the under-shield space and provides greater clearance for the PCB component.

As shown in FIGS. 4 and 5, the lower edge portions of the sidewalls 108 include mounting feet 140. The internal wall 128 also includes mounting feet 144. The mounting feet 140, 144 may be formed with castellations (e.g., formations with alternating notches and projections, etc.). The mounting feet 140, 144 are preferably configured to provide structure for connecting the sidewalls 108 and internal wall 128, respectively, to a substrate, such as a PCB 248 having components 252 thereon as shown in FIGS. 13 and 14. For example, the mounting feet 140, 144 provide areas for soldering to the substrate. In such embodiments, the notches allow solder to flow around the projections for securing the shield 100 to the substrate. In other embodiments, the mounting feet 140, 144 may fit in corresponding openings in a substrate for securing the shield 100 to the substrate. In still further embodiments, a shield may not include any spaced-apart mounting feet along its lower edge portions. Instead, the shield may include sidewalls each having a generally continuous lower edge portion. In addition, alternative means besides soldering may also be employed for securing the shield 100 to a substrate.

Although FIGS. 1 through 3 illustrates the shield 100 having a rectangular shape, other exemplary embodiments may include shields having different configurations (e.g., circular, triangular, irregular, other non-rectangular shapes, etc.). FIG. 1 also shows two pockets 120 that are side-by-side and that have the same rectangular shape (e.g., defined by four sidewall portions, etc.). Other exemplary embodiments may be configured differently, such as having more or less than two pockets (e.g., a single pocket, three pockets, etc.), pockets having different shapes from each other, pockets having non-rectangular shapes (e.g., circular, triangular, irregular, other non-rectangular shapes, etc.), and/or pockets at other locations (e.g., in the sidewalls, etc.).

Figure 10:
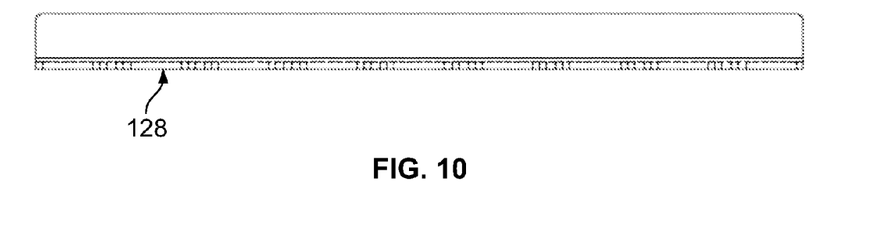
FIG. 10 is a top view of the internal wall or divider shown in FIG. 8 including example dimensions in millimeters (inches) that may be used for the internal wall or divider.
Figure 11:
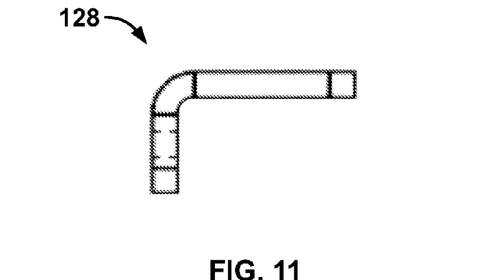
FIG. 11 is an end view of the internal wall or divider shown in FIG. 8 including example dimensions in millimeters (inches) that may be used for the internal wall or divider.

FIGS. 3, 4, 6, 7, 10, and 11 provide example dimensions in millimeters (inches) that may be used for the shield 100 in this exemplary embodiment. For example, the shield 100 may have a length of about 30 mm and a width of about 18 mm as shown in FIG. 3. The shield 100 may be less than about one millimeter (mm) tall. For example, the external overall height of the shield 100 may be about 0.87 mm as shown in FIG. 4. The dielectric coating may be disposed only along the pockets 120 and/or be spaced apart from the shield's sidewalls 108 by about 0.25 millimeters (mm) or more. The dielectric coating may have a thickness of about 15 microns. The surface of the dielectric coating may sit about 50 microns below the inside surface of the shield 100. As shown in FIG. 7, the pockets may be about 0.07 mm deep, and the shield's sidewalls and portion of the cover 104 without the pockets 120 may be about 0.15 mm thick. As shown in FIGS. 10 and 11, the internal wall 128 may have a length of about 16.5 mm, a thickness of about 0.15 mm (+/−0.015 mm), a height of about 0.72 mm, and a width of about 1.2 mm. The dimensions provided in this application and drawings are for purpose of illustration only as other exemplary embodiments may have a different configuration, such as a different size (e.g., larger or smaller) and/or a different shape (e.g., non-rectangular, etc.), etc.

Figure 12:
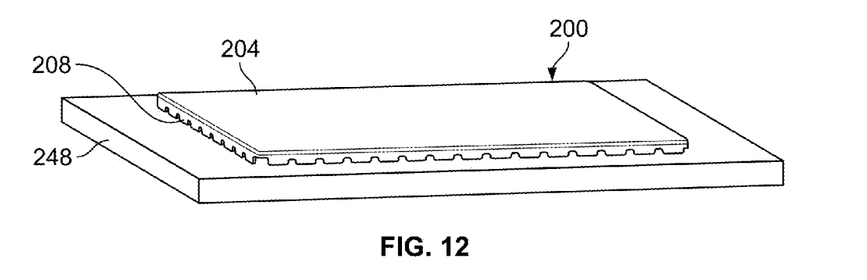
FIG. 12 is a perspective view showing an exemplary embodiment of an EMI shield positioned on a printed circuit board (PCB)

FIGS. 12, 13, and 14 illustrate an exemplary embodiment of a board level shield (BLS) 200 with increased under-shield space and/or greater component clearance under the shield 200. The shield 200 includes a cover 204, sidewalls 208, and an internal wall 228. The cover 204 includes pockets or cavities 220 (broadly, recesses or recessed portions) in which may be positioned dielectric material. As shown in FIGS. 13 and 14, the BLS 200 is installed (e.g., mounted, attached, soldered, etc.) to a printed circuit board (PCB) 248 (broadly, substrate) such that the PCB components 252 (FIG. 13) are under the shield 200. FIG. 14 shows the additional under-shield clearance provided by the pockets 220 as the top of the PCB component 252 extends above the portion of the cover 204 adjacent the sidewall 208.

Figure 15:
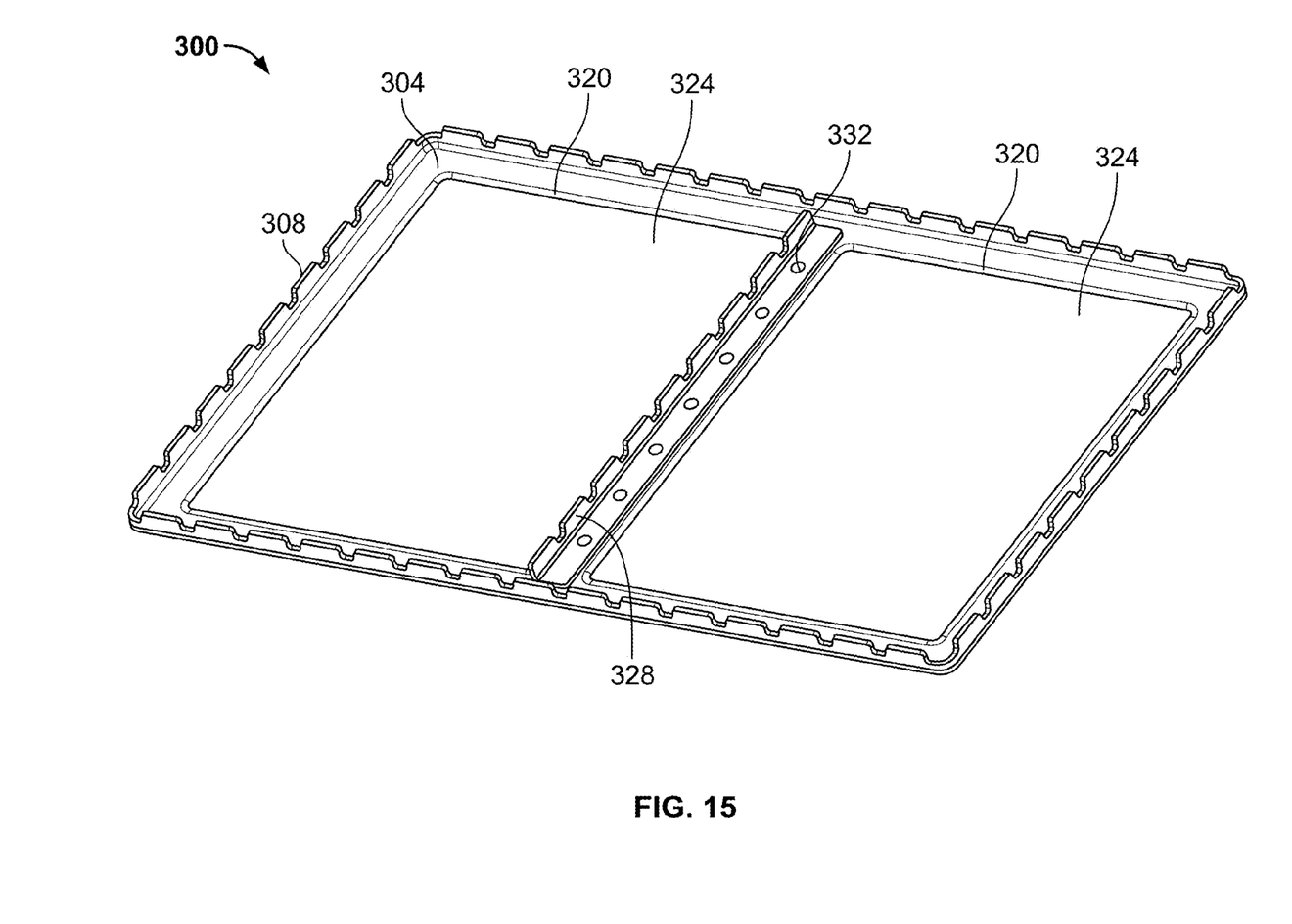
FIG. 15 is a perspective underside view of an EMI shield with increased under-shield space according to another exemplary embodiment in which dielectric material is along and within the pockets and dielectric material is outside of and between the pockets underneath the internal wall or divider.

FIG. 15 illustrates another exemplary embodiment of a shield 300 with increased under-shield space and/or greater component clearance under the shield 300. The shield 300 includes a cover 304, sidewalls 308, and an internal wall 328. The internal wall 328 may be welded to the cover 304 at weld spots 332. The cover 304 includes pockets or cavities 320 (broadly, recesses or recessed portions). Dielectric material 324 (e.g., a dielectric coating, electrical insulation, etc.) is provided within and/or along the pockets 320 (broadly, recesses or recessed portions). The dielectric material 324 may also be disposed outside the pockets 320, e.g., along the cover 304 between the pockets 320, etc.

Figure 16:
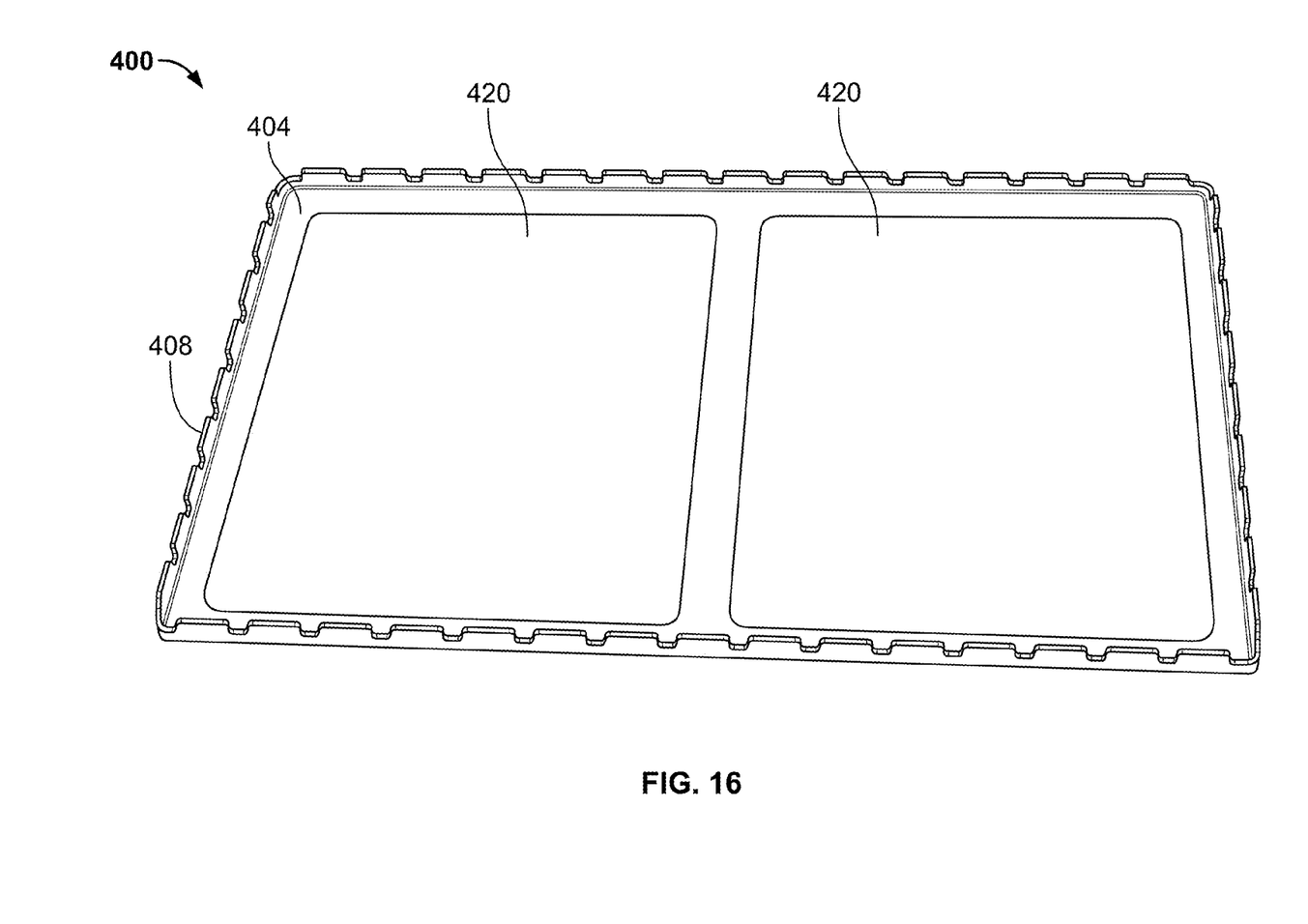
FIG. 16 is a perspective underside view of an EMI shield with increased under-shield space according to another exemplary embodiment showing the shield without any dielectric material along or within the pockets and without any internal wall or divider between the pockets.

FIG. 16 illustrates an exemplary embodiment of a shield 400 with increased under-shield space and/or greater component clearance under the shield 400. The shield 400 includes a cover 404 and sidewalls 408. The cover 404 includes pockets or cavities 420 (broadly, recesses or recessed portions). Although not shown in FIG. 16, dielectric material may be positioned along and/or within the pockets 420. The shield 400 is shown in FIG. 16 without any internal walls, though other embodiments may include one or more internal walls, dividers, or partitions, e.g., between the pockets 420, etc.

Figure 17:
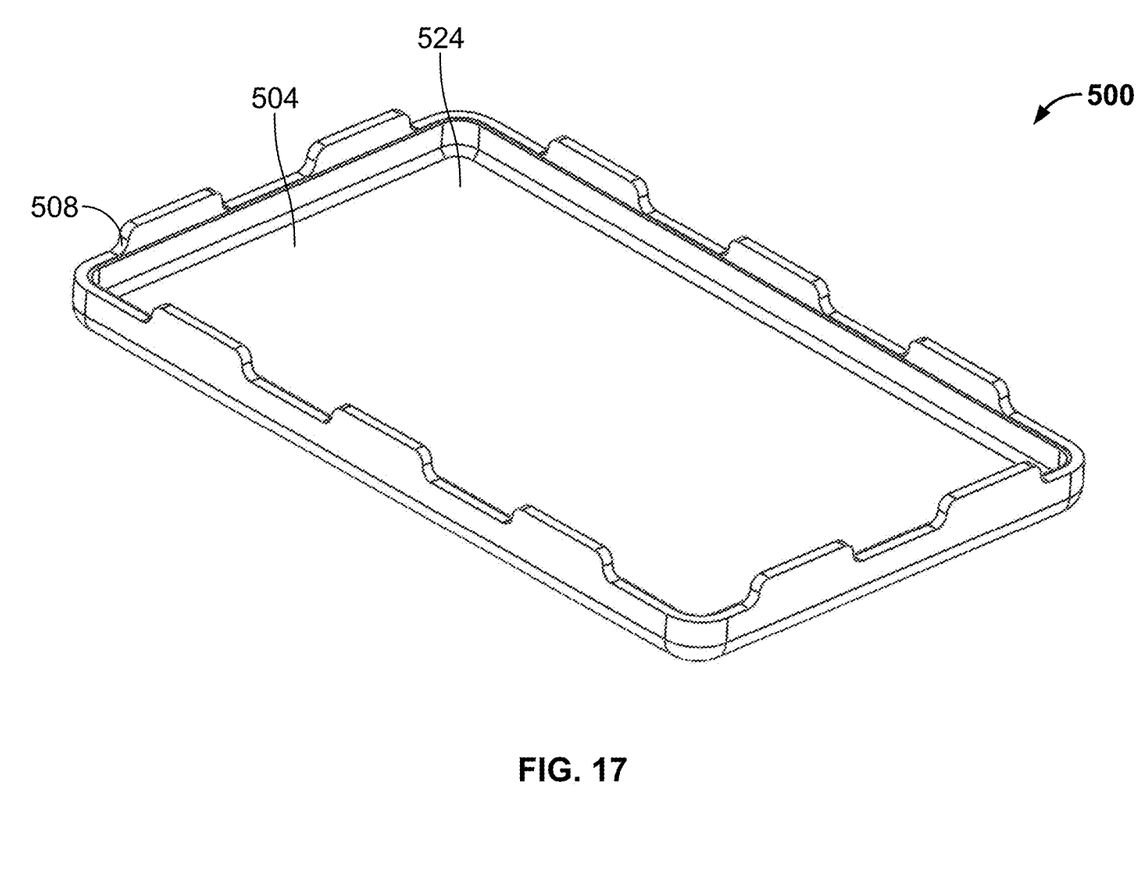
FIG. 17 is a perspective underside view of an EMI shield according to another exemplary embodiment in which dielectric material is along the shield's cover and sidewalls, but the shield does not include any pockets of cavities in which the dielectric material is disposed.

FIG. 17 illustrates another exemplary embodiment of a shield 500. The shield 500 includes a cover 504 and sidewalls 508. Dielectric material 524 (e.g., a dielectric coating, electrical insulation, etc.) is provided along the shield's cover 504 and portions of the sidewalls 508. In this example, the shield 500 does not include any recessed portions, pockets, or cavities in which the dielectric material 524 is disposed. Instead, the dielectric material 524 is provided along the inner surfaces (e.g., non-recessed portions, etc.) of the shield's cover 504 and/or sidewalls 508.

The shields (e.g., 100, 200, 300, 400, 500, etc.) disclosed herein may be formed from a wide range of electrically-conductive materials. For example, the covers (e.g., 104, 204, 304, 404, etc.) and sidewalls (e.g., 108, 208, 308, 408, etc.) may be formed from metals or metal alloys, such as cold rolled steel (e.g., tin-plated cold rolled steel, etc.), sheet metal, stainless steel, copper alloys (e.g., tin-plated copper alloys, etc.), nickel-silver alloys (e.g., nickel-silver alloy 770, etc.), copper-nickel alloys, carbon steel, brass, copper, aluminum, copper-beryllium alloys, phosphor bronze, steel, alloys thereof, among other suitable electrically-conductive materials. The sidewalls and/or cover of the shield may also be formed from a plastic material coated with electrically-conductive material. In one exemplary embodiment, the sidewalls and the cover of a shield are formed from a sheet of nickel-silver alloy having a thickness of about 0.15 millimeters. The materials and dimensions provided herein are for purposes of illustration only, as the shield may be made from different materials and/or have different dimensions depending, for example, on the particular application, such as the electrical components to be shielded, space considerations within the overall electronic device, EMI shielding and heat dissipation needs, and other factors.

The shields (e.g., 100, 200, 300, 400, 500, etc.) disclosed herein may be provided with one or more different dielectric materials in various ways. In some exemplary embodiments, the following printing and UV curing process may be used to provide dielectric material to shields, including shields with and without any recessed portions. For example, the printing and UV curing process may be used to provide dielectric material along a shield's cover and/or sidewalls where the shield (e.g., shield 500 shown in FIG. 17, etc.) does not include any recessed portions, pockets, or cavities. In this example, the dielectric material may be provided along an inner surface (e.g., non-recessed portion, etc.) along the shield's cover and/or sidewalls. Or, for example, the printing and UV curing process may be used to provide dielectric material along or within at least one or more recessed portions, pockets, or cavities along an inner surface of the shield's cover and/or sidewalls. Accordingly, aspects of the present disclosure should not be limited to only shields having one or more recessed portions, pockets, or cavities. This is because some exemplary embodiments include shields having dielectric material thereon where the shields do not include any recessed portions, pockets, or cavities, whereas other embodiments include shields having dielectric material thereon where the shields include recessed portions, pockets, or cavities.

In this exemplary process, the parts are first placed into fixtures in an orientation such that the surface (e.g., an inner surface of a shield's cover and/or one or more sidewalls, etc.) to be printed is facing upward. The fixtures are then placed into a printing machine. The printing program is activated. Acrylate polymer fluid is dispensed by droplets falling onto the part from the print nozzle. The droplets are forced out of the print nozzle by a pressure pulse created by a piezoelectric material changing shape in an acrylate polymer fluid filled chamber. After the printing fluid falls onto the part, the printing machine cures the fluid into a solid through ultraviolet (UV) photosensitization and polymerization during the printing process cycle. The hardening process is essentially instantaneous, and the UV wavelength is in the 350 to 400 nanometer range in this example.

As compared to a traditional insulation process of die cut polyimide labels that are physically pressed or applied onto a shield, this exemplary printing and UV curing process may provide one or more of the following benefits or advantages: (1) the handling is simplified and better conformity to substrate contours as well as improved adhesion to substrate, especially over changing contours; (2) the dielectric material is thinner than typical polyimide die cut labels; (3) no pressure is applied to the part to adhere the dielectric material to the substrate; and (4) changes to dielectric geometry can be made via software changes without the need for tooling changes.

As compared to thermal inks, this exemplary printing and UV curing process may provide one or more of the following benefits or advantages: (1) the printing and UV curing process does not have solvents thus reducing or eliminating the emission of Volatile Organic Compounds (VOCs); (2) heat is not needed to cure the ink thereby allowing improved energy consumption; and (3) because there are no evaporated solvents, the edge definition is better thus allowing smaller details to be created.

According to various aspects, exemplary embodiments are disclosed of EMI shields with increased under-shield space and/or greater component clearance for one or more components under the shield. In an exemplary embodiment, a shield generally includes one or more recessed portions along an inner surface of the shield. The one or more recessed portions may be along an inner surface of the shield's cover or upper surface and/or along an inner surface of at least one of the shield's one or more sidewalls. Dielectric material is along the inner surface of the shield within at least the one or more recessed portions. Dielectric material may also be along one or more non-recessed portions of the shield. The one or more recessed portions may provide increased under-shield space and/or greater clearance for one or more components under the shield. The dielectric material may inhibit the one or more recessed portions from directly contacting and electrically shorting one or more components when the one or more components are under the shield.

In an example embodiment, a dielectric coating may be along the inner surface of the cover within one or more recessed portions of the cover. The dielectric coating may deposited or dispensed (e.g., via an ink jet process, print nozzle, other suitable process, etc.) and then cured with ultraviolet light. The one or more recessed portions may include one or more pockets or cavities that are etched, embossed, machined, forged, etc. into the cover. A thickness of the cover at the one or more recessed portions may be less than a thickness of the cover along a perimeter of the cover. The one or more recessed portions may have a reduced thickness defined by removal of a portion of the material from which the cover is made. The one or more recessed portions may comprise two disjoint pockets spaced apart from each other and separated by a thicker portion of the cover.

One or more sidewalls may depend from the cover and be configured for installation to the substrate generally about the one or more components on the substrate. An internal wall may be between the two disjoint pockets. The internal wall, the cover, and the one or more sidewalls may cooperatively define a plurality of individual EMI shielding compartments, such that different components on the substrate are positionable in different compartments and are provided with EMI shielding by virtue of the EMI shielding compartments inhibiting the ingress and/or egress of EMI into and/or out of each EMI shielding compartment. The shield's cover and the one or more sidewalls may be integrally formed from a single piece of electrically-conductive material so as to have a monolithic or single piece construction.

Also disclosed are exemplary embodiments of methods relating to making EMI shields. In an exemplary embodiment, a method generally includes providing dielectric material along an inner surface of the shield having one or more recessed portions such that the dielectric material is within at least the one or more recessed portions. The one or more recessed portions may provide increased under-shield space and/or greater clearance for one or more components under the shield. The dielectric material may inhibit the one or more recessed portions of the shield from directly contacting and electrically shorting one or more components when the one or more components are under the shield.

The method may include removing material from the shield to create the one or more recessed portions along the inner surface of the shield. The dielectric material may be provided by coating dielectric material along the inner surface of the shield within at least the one or more recessed portions. A dielectric material may be deposited or dispensed along the inner surface of the shield within at least the one or more recessed portions, and then the dielectric material may be cured with ultraviolet light.

The method may include stamping a flat pattern partial profile into a piece of material whereby the flat pattern partial profile includes the cover and one or more sidewalls of the shield, and then creating the one or more recessed portions in the stamped piece of material. The method may further include forming the stamped piece of material before or after creating the one or more recessed portions in the stamped piece of material, e.g., by bending, folding, or drawing portions of the stamped piece of material that define the one or more sidewalls. The method may additionally include welding an internal wall to the inner surface of the cover. The internal wall, the cover, and one or more sidewalls of the shield may cooperatively define a plurality of individual EMI shielding compartments, such that different components on a substrate are positionable in different compartments and are provided with EMI shielding by virtue of the EMI shielding compartments inhibiting the ingress and/or egress of EMI into and/or out of each EMI shielding compartment. Also, the method may include integrally forming the shield's cover and one or more sidewalls from a single piece of electrically-conductive material such that the cover and the one or more sidewalls have a monolithic or single piece construction. The method may include removing material from the shield, which reduces thickness of the shield and provides up to 80% material thickness reduction at the one or more recessed portions.

Exemplary embodiments of methods relating to providing shielding for one or more components on a substrate are also disclosed. In an exemplary embodiment, a method generally includes installing a shield to a substrate such that one or more components are disposed under one or more recessed portions along an inner surface of the shield. Dielectric material is within at least the one or more recessed portions. The one or more recessed portions provide increased under-shield space and/or greater clearance for the one or more components under the shield. The dielectric material inhibits the one or more recessed portions of the shield from directly contacting and electrically shorting the one or more components under the shield.

In exemplary embodiments, the EMI shield includes a cover, top, or upper surface and one or more sidewalls. The one or more sidewalls may comprise a single sidewall, may comprise a plurality of sidewalls that are separate or discrete from each other, or may comprise a plurality of sidewalls that are integral parts of a single-piece EMI shield, etc.

In exemplary embodiments, the EMI shield's cover or upper surface and the one or more sidewalls may be integrally formed (e.g., stamped, bent, folded, etc.) from a single piece of electrically-conductive material so as to have a monolithic construction. The shield's cover or upper surface may be integrally formed with the sidewalls such that the sidewalls depend downwardly relative to the cover or upper surface. In other exemplary embodiments, the EMI shield's cover or upper surface may be made separately and not integrally with the sidewalls. In some embodiments, the EMI shield may comprise a two-piece shield in which the shield's cover or lid is removable from and reattachable to the sidewalls.

In some exemplary embodiments, the EMI shield may include one or more interior walls, dividers, or partitions that are attached to and/or integrally formed with the EMI shield. In such embodiments, the shield's cover, sidewalls, and interior walls may cooperatively define a plurality of individual EMI shielding compartments. When the EMI shield is installed (e.g., adhesively attached, soldered to soldering pads, etc.) to a substrate (e.g., printed circuit board, etc.), components on the substrate may be positioned in different compartments such that the components are provided with EMI shielding by virtue of the EMI shielding compartments inhibiting the ingress and/or egress of EMI into and/or out of each EMI shielding compartment. In other exemplary embodiments, the EMI shield may not include or may be free of interior walls, dividers, or partitions such that the sidewalls and cover of the EMI shield generally define a single interior space or compartment.

In some exemplary embodiments, the EMI shield's cover or upper surface may include a generally flat, planar and/or central pick-up surface configured for use in handling the EMI shield with pick-and-place equipment (e.g., vacuum pick-and-place equipment, etc.). The pick-up surface may be configured for use as a pick-up area that may be gripped or to which suction may be applied by the pick-and-place equipment for handling during, for example, fabrication of the shield and/or installation of the shield to a PCB. The central location of the pick-up surface may allow for balanced manipulation of the shield during handling. In other exemplary embodiments, the EMI shield may, for example, have tabs at the corners and/or along the side edges for use as pick-up surfaces in addition to or in place of centrally located pick-up surfaces.

In some exemplary embodiments, the EMI shield's cover or upper surface may include one or more apertures or holes, which may facilitate solder reflow heating interiorly of the shield and/or enable cooling of the components under the shield and/or permit visual inspection of the components beneath the shield. In some of these exemplary embodiments, the holes may be sufficiently small to inhibit passage of interfering EMI. The particular number, size, shape, orientation, etc. of the holes may vary depending, for example, on the particular application (e.g., sensitivity of the electronics where more sensitive circuitry may necessitate the use of smaller diameter holes, etc.). In still other exemplary embodiments, the shield may include a cover or upper surface that does not have any such holes.

Exemplary embodiments disclosed herein may provide one or more (but not necessarily any or all) of the following advantages over some existing board level EMI shields. For example, exemplary embodiments disclosed herein may provide similar or greater component clearance under the shield compared with standard fabricated shields. Other approaches have included thin foil top that is welded to a BLS frame. Exemplary embodiments disclosed herein allow less welding and part handling as compared to a conventional BLS in which a foil is welded to a frame. But the foil can be difficult to handle, align, and weld to the frame due to the great number of weld points. Other approaches have used an adhesive cover instead of the foil. But the adhesive can delaminate and create handling issues or EMI leakage issues. Exemplary embodiments disclosed herein have also had excellent resistance to humidity, salt soaking and salt spray testing. In some exemplary embodiments disclosed herein, thin-gauge precision metal stamping is performed with high precision (e.g., less than 0.05 mm XY dimensional tolerances, etc.). Pockets or cavities may be created in a thin-gauge metal, e.g., a metal sheet having a thickness of about 0.15 mm, etc. For example, pockets or cavities may be created by removing (e.g., via etching, machining, etc.) material such that there is up to an 80% material thickness reduction for the internal pocket creation. The pockets or cavities provide greater PCB component clearances and also accommodate increased space for additives, such as thermal interface materials, dielectric materials, electrical insulation, combinations thereof, etc. The recessed portions, pockets, or cavities may be placed at various depths and/or at different locations based on the heights and locations of the individual components that will be positioned under the shield. The processes used to create the EMI shields disclosed herein may provide features and/or allow scale and economy to match high volume electronics manufacturing.

Exemplary embodiments disclosed herein include one or more recessed portions (e.g., pockets or cavities, etc.) that provide increased under-shield space and/or greater component clearance under the shield such that a lower profile or shorter shield may be used. This enables increasingly miniaturized electronic devices that are slimmer and lighter with the increase of multi-functional components being packed into tighter space requirements. Accordingly, exemplary embodiments disclosed herein may allow for reduced or minimized overall circuit assembly stack heights for denser electronic assemblies, thinner devices with improved aesthetics and brand image, BLS integration with other materials for multi-functional properties, and accommodation for more economical electronic component sizes.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances. For example, the tolerances may be +/−0.1 mm for dimensions provided to three decimal places (X.XXX), the tolerances may be +/−0.2 mm for dimensions provided to two decimal places (X.XX), and the tolerances may be +/−0.4 mm for dimensions provided to one decimal place (X.X). The angular tolerances may be +/−1.0 degree for angular dimensions provided to one decimal place (X.X°) and +/−3.0 degrees for angular dimensions provided without any decimal place (X°). Whether or not modified by the term "about", the claims include equivalents to the quantities.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A method comprising providing dielectric material within one or more recessed portions along an inner surface of an electromagnetic interference (EMI) shield, the inner surface defined by a piece of material, wherein the method includes:
    creating the one or more recessed portions in the piece of material before providing the dielectric material within the one or more recessed portions along the inner surface of the shield;
    stamping a flat pattern partial profile into the piece of material after creating the one or more recessed portions in the piece of material, whereby the flat pattern partial profile includes a cover and one or more sidewalls of the shield; and
    forming the stamped piece of material by bending, folding, or drawing portions of the stamped piece of material that define the one or more sidewalls;
    whereby the one or more recessed portions provide at least one of increased under-shield space and greater clearance for one or more components under the shield, and whereby the dielectric material inhibits the one or more recessed portions of the shield from directly contacting and electrically shorting one or more components when the one or more components are under the shield.

2. The method of claim 1, wherein the method includes removing material from the piece of material to create the one or more recessed portions.

3. The method of claim 2, wherein removing material comprises etching the piece of material to create the one or more recessed portions.

4. The method of claim 1, wherein providing dielectric material comprises coating a dielectric coating onto the inner surface of the shield within at least the one or more recessed portions such that the dielectric coating prevents the one or more recessed portions from directly contacting and electrically shorting one or more components when the one or more components are under the shield.

5. The method of claim 1, wherein providing dielectric material comprises depositing a dielectric material along the inner surface of the shield within at least the one or more recessed portions, and then curing the dielectric material with ultraviolet light.

6. The method of claim 1, wherein:
the shield includes the cover and the one or more sidewalls depending from the cover;
the one or more recessed portions are along an inner surface of the cover and/or an inner surface of at least one of the one or more sidewalls; and
the method further comprises welding an internal wall to the inner surface of the cover, wherein the internal wall, the cover, and one or more sidewalls of the shield cooperatively define a plurality of individual EMI shielding compartments, such that different components on a substrate are positionable in different compartments and are provided with EMI shielding by virtue of the EMI shielding compartments inhibiting the ingress and/or egress of EMI into and/or out of each EMI shielding compartment.

7. The method of claim 1, wherein the method includes removing electrically-conductive material from the piece of material to create the one or more recessed portions before providing the dielectric material within the one or more recessed portions along the inner surface of the shield, whereby the electrically-conductive material removal reduces thickness of the shield and provides up to 80% material thickness reduction of the electrically-conductive material at the one or more recessed portions.

8. The method of claim 1, further comprising installing the shield to a substrate such that one or more components on the substrate are disposed under the one or more recessed portions.

9. The method of claim 1, wherein providing dielectric material within the one or more recessed portions along the inner surface of the shield comprises providing an ultraviolet (UV) curable dielectric material within the one or more recessed portions along the inner surface of the shield and curing the dielectric material through exposure to UV, whereby the UV-cured dielectric material inhibits the portion of the EMI shield from directly contacting and electrically shorting one or more components.

10. The method of claim 9, wherein:
providing the UV curable dielectric material comprises dispensing acrylate polymer fluid from a nozzle onto the shield; and
curing the dielectric material comprises curing the acrylate polymer fluid into a solid through UV photosensitization and polymerization.

11. The method of claim 9, wherein:
providing the UV curable dielectric material comprises dispensing acrylate polymer fluid from a print nozzle onto the shield, wherein the acrylate polymer fluid is forced out of the print nozzle by a pressure pulse created by a piezoelectric material changing shape in an acrylate polymer fluid filled chamber; and
curing the dielectric material comprises curing the acrylate polymer fluid into a solid through UV photosensitization and polymerization during the printing process cycle, wherein the UV wavelength is in the 350 to 400 nanometer range.

12. The method of claim 9, wherein the UV-cured dielectric material prevents the one or more recessed portions from directly contacting and electrically shorting one or more components when the one or more components are under the shield.

13. The method of claim 9, wherein:
the shield includes the cover and the one or more sidewalls depending from the cover and configured for installation to the substrate generally about the one or more components on the substrate; and
providing the UV curable dielectric material comprises providing the UV curable dielectric material along at least one of an inner surface of the cover and an inner surface of at least one of the one or more sidewalls.

14. The method of claim 1, further comprising providing dielectric material along one or more non-recessed portions along the inner surface of the shield.

15. The method of claim 14, wherein:
the shield includes the cover and the one or more sidewalls depending from the cover; and
the one or more recessed portions are along at least one of an inner surface of the cover and an inner surface of at least one of the one or more sidewalls.

16. The method of claim 15, wherein:
the one or more recessed portions are along the inner surface of the cover; and
a thickness of the cover at the one or more recessed portions is less than a thickness of the cover along a perimeter of the cover, which thereby provides increased space and greater clearance for components under the one or more recessed portions.

17. The method of claim 1, wherein the one or more recessed portions comprise a plurality of disjoint pockets separated by one or more thicker portions of the shield.

18. The method of claim 17, wherein the method includes etching, embossing, machining, or forging the plurality of disjoint pockets into the inner surface of the shield.

19. The method of claim 1, wherein the one or more recessed portions comprise two disjoint pockets that are side-by-side and spaced apart from each other with a gap therebetween defined by a thicker portion of the shield.

20. The method of claim 1, wherein the piece of material is a single piece of electrically-conductive material, and wherein the method further comprises integrally forming the shield from the single piece of electrically-conductive material such that the shield has a monolithic or single piece construction.

21. The method of claim 1, wherein creating the one or more recessed portions in the piece of material comprises:
applying a mask to the piece of material;
removing portions of the mask by laser ablation or chemical dissolution only at locations at which the one or more recessed portions will be created to thereby expose areas of the piece of material that will be etched;
introducing an etching chemical to the exposed areas of the piece of material to thereby form the one or more recessed portions; and
removing any remaining portions of the mask from the piece of material.

22. The method of claim 1, wherein providing dielectric material within the one or more recessed portions along the inner surface of the shield comprises at least one of:

depositing or dispensing a dielectric coating via an ink jet process or print nozzle; and providing a dielectric coating comprising a blend of polymers including an acrylate polymer, the dielectric coating having electrical resistance greater than 4 gigaohms measured at 1000 volts with a 1 millimeter probe tip diameter and 100 gram weight, and the dielectric coating being capable of withstanding lead-free reflow temperatures of at least 260 degrees Celsius.

* * * * *